US 6,545,848 B1

(12) United States Patent
Terunuma

(10) Patent No.: US 6,545,848 B1
(45) Date of Patent: Apr. 8, 2003

(54) MAGNETIC TRANSDUCER, THIN FILM MAGNETIC HEAD AND METHOD OF MANUFACTURING THE SAME

(75) Inventor: Koichi Terunuma, Tokyo (JP)

(73) Assignee: TDK Corporation, Tokyo (JP)

( * ) Notice: Subject to any disclaimer, the term of this patent is extended or adjusted under 35 U.S.C. 154(b) by 8 days.

(21) Appl. No.: 09/599,896

(22) Filed: Jun. 23, 2000

(30) Foreign Application Priority Data

Jun. 30, 1999 (JP) .......................................... 11-184662

(51) Int. Cl.[7] ................................................. G11B 5/39
(52) U.S. Cl. ............................... 360/324.12; 360/324.1
(58) Field of Search ....................... 360/324.11, 324.12, 360/327.2–327.33, 324.1

(56) References Cited

U.S. PATENT DOCUMENTS

| | | | | |
|---|---|---|---|---|
| 5,285,339 A | * | 2/1994 | Chen et al. .............. | 360/327.3 |
| 5,521,005 A | * | 5/1996 | Kitada et al. ............. | 428/332 |
| 5,528,440 A | | 6/1996 | Fontana et al. ......... | 360/324.12 |
| 5,784,226 A | * | 7/1998 | Ishi ........................ | 360/327.22 |
| 6,111,722 A | * | 8/2000 | Fukuzawa et al. ..... | 360/324.12 |
| 6,118,624 A | * | 9/2000 | Fukuzawa et al. ..... | 360/324.12 |
| 6,153,319 A | * | 11/2000 | Hasegawa .............. | 360/324.12 |
| 6,157,526 A | * | 12/2000 | Watanabe et al. ...... | 360/324.12 |
| 6,249,406 B1 | * | 6/2001 | Gill et al. ............... | 360/324.11 |
| 6,266,218 B1 | * | 7/2001 | Carey et al. ............ | 360/324.12 |
| 6,295,186 B1 | * | 9/2001 | Hasegawa et al. ...... | 360/324.11 |

FOREIGN PATENT DOCUMENTS

| | | |
|---|---|---|
| JP | 6-84145 | 3/1994 |
| JP | 8-45032 | 2/1996 |

* cited by examiner

Primary Examiner—Jefferson Evans
(74) Attorney, Agent, or Firm—Oliff & Berridge, PLC

(57) ABSTRACT

A magnetic transducer and a thin film magnetic head capable of suppressing a reduction in reproducing output and of obtaining an appropriate bias magnetic field and a method of manufacturing the same. An MR element comprises a stack sensing an external magnetic field and magnetic domain control films applying a bias magnetic field to the stack. The magnetic domain control films are fabricated with a stack of magnetic domain control ferromagnetic films made of a ferromagnetic material and magnetic domain control antiferromagnetic films made of an antiferromagnetic material. The magnetic domain control ferromagnetic films are fabricated to have the magnetostriction $\lambda s$ within a range of $-15 \times 10^{-6} < \lambda s < 0$. The magnetostriction $\lambda s$ in such a range suppresses increase in hysteresis in a change of the magnetization of the magnetic domain control ferromagnetic film to an external magnetic field. The magnetic domain control ferromagnetic films always produce a constant bias magnetic field. As a result, output from the stack becomes stable.

16 Claims, 13 Drawing Sheets

MAGNETIC TRANSDUCER, THIN FILM MAGNETIC HEAD AND METHOD OF MANUFACTURING THE SAME

BACKGROUND OF THE INVENTION

1. Field of the Invention

The present invention relates to a magnetic transducer such as a magnetoresistive element, a thin film magnetic head and a method of manufacturing the same. More particularly, the present invention relates to a magnetic transducer comprising a magnetic domain control film to suppress, for example, Barkhausen noise or the like, a thin film magnetic head and a method of manufacturing the same.

2. Description of the Related Art

Recently, an improvement in performance of a thin film magnetic head has been sought in accordance with an increase in a surface recording density of a hard disk drive. A composite thin film magnetic head, which has a stacked structure comprising a reproducing head having a magnetoresistive element (hereinafter also referred to as an MR element) and a recording head having an inductive-type magnetic transducer, is widely used as a thin film magnetic head.

MR elements include an AMR element using a magnetic film (an AMR film) exhibiting an anisotropic magnetoresistive effect (an AMR effect), a GMR element using a magnetic film (a GMR film) exhibiting a giant magnetoresistive effect (a GMR effect), and so on.

The reproducing head using the AMR element is called an AMR head or simply an MR head, and the reproducing head using the GMR element is called a GMR head. The AMR head is used as the reproducing head whose surface recording density exceeds 1 gigabit per square inch (0.155 gigabits per square centimeters), and the GMR head is used as the reproducing head whose surface recording density exceeds 3 gigabits per square inch (0.465 gigabits per square centimeters).

As the GMR film, a "multi-layered type (antiferromagnetic type)" film, an "inductive ferromagnetic type" film, a "granular type" film, a "spin valve type" film and the like are proposed. Of these types of films, the spin valve type GMR film is most efficient as the GMR film which is relatively simple in structure, exhibits a great change in resistance in a low magnetic field, and is suitable for mass-production.

FIG. 20 is a sectional view of the magnetoresistive element, which uses a spin valve type GMR film (hereinafter referred to as a spin valve film) disclosed in Unexamined Patent Application Publication No. Hei 8-45032, parallel to the opposed face (medium-facing surface or air bearing surface; ABS) to a magnetic recording medium. The magnetoresistive element has the stacked structure comprising a free layer 63 made of a soft magnetic material, a spacer layer 65 made of a nonmagnetic metal, a pinned layer 70 made of a ferromagnetic material and an antiferromagnetic layer 66 made of an antiferromagnetic material in the order named on an underlayer 62 made of Ta (tantalum) or the like. The antiferromagnetic layer 66 is covered with a protective layer 67. Exchange coupling is induced on an interface between the pinned layer 70 and the antiferromagnetic layer 66, and thus the orientation of the magnetization of the pinned layer 70 is fixed in a direction indicated by 71 in the drawing, for instance. On the other hand, the orientation of the magnetization of the free layer 63 is freely changed in accordance with a signal magnetic field from a magnetic recording medium because the free layer 63 is isolated from the antiferromagnetic layer 66 by the spacer layer 65.

Reproducing of information using such a spin valve film, that is, the detection of a signal magnetic field from a magnetic recording medium is performed as follows. A detecting current (sense current) as a direct constant current is fed through the free layer 63 through lead electrode layers 92a and 92b in the direction indicated by 64 in the drawing, for example. Receiving the signal magnetic field from the magnetic recording medium rotates the magnetization of the free layer 63. The current passing through the free layer 63 is subjected to the resistance in accordance with a relative angle between the orientation of the magnetization of the free layer 63 and the fixed orientation of the magnetization of the pinned layer 70 and thus the resistance is detected as a voltage.

In such a magnetoresistive element, it is considered to apply a bias magnetic field to the free layer 63 to reduce Barkhausen noise. The Barkhausen noise is caused when many magnetic domains having random orientations of magnetizations change to one large magnetic domain, that is, change to a single magnetic domain, having a common orientation of magnetization under the influence of an external magnetic field.

Providing a magnetic domain control film produces the bias magnetic field. The magnetic domain control film is consisted of two layers of magnetic domain control ferromagnetic films 90a and 90b formed to sandwich the free layer 63 and of magnetic domain control antiferromagnetic films 90a and 90b deposited thereon, respectively. The orientation of the magnetizations of the domain control ferromagnetic films 90a and 90b is fixed by exchange coupling on each interface between the magnetic domain control ferromagnetic film 90a and the magnetic domain control antiferromagnetic film 90a, and the magnetic domain control ferromagnetic film 90b and the magnetic domain control antiferromagnetic film 90b in the direction indicated by 90c in the drawing. The bias magnetic field indicated by 64 in the drawing is applied to the free layer 63 sandwiched between the magnetic domain control ferromagnetic films 90a and 90b. The bias magnetic field flows to the same direction as sense current and is called as a "longitudinal bias".

The explanation of magnetostriction of the magnetic domain control ferromagnetic films 90a and 90b will be made here. FIG. 21 simply illustrates the orientation of the magnetizations of the magnetic domain control ferromagnetic films 90a and 90b and a bias magnetic field applied to the free layer 63 as seen from above of the magnetoresistive element (the direction indicated by the arrow XXI in FIG. 20). The face indicated by reference character S in the drawing is a medium-facing surface opposite to the magnetic recording medium.

The magnetoresistive element is overlaid on the shield layer (not shown) or the like to make the reproducing head. It is known that the tensile stress F is applied on such reproducing head in the direction orthogonal to the medium-facing surface S. At this time, "tensile strain" (strain in the direction of the expansion Exp) parallel to the tensile stress F and "compression strain" (strain in the direction of the compression Com) perpendicular to the tensile stress F are developed in the magnetic transducer. If the magnetostrictios λs of the magnetic domain control ferromagnetic films 90a and 90b is positive, the magnetization thereof may orient the same direction as tensile strain. That is, the magnetization of the magnetic domain control ferromagnetic films 90a and 90b rotates toward the tensile direction as indicated by dashed lines in the drawing. In this case, the bias magnetic field produced in the free layer 63 is weakened by the rotation of the magnetic domain control ferromagnetic films 90a and 90b.

Unexamined Patent Application Publication No. Hei 6-84145 proposes that the magnetostriction $\lambda s$ of the magnetic domain control ferromagnetic film is a negative value having a large absolute value, specifically, $\lambda s \leq -15 \times 10^{-6}$. If the magnetostriction $\lambda s$ of the magnetic domain control ferromagnetic film is negative, when the tensile stress F is applied to the magnetic domain control ferromagnetic films 90a and 90b as in FIG. 21, the magnetization thereof may orient to the direction of compression strain. In this case, the magnetic domain control ferromagnetic films 90a and 90b do not rotate and therefore the bias magnetic field produced in the free layer 63 is not weakened.

However, if the magnetostriction $\lambda s$ of the magnetic domain control ferromagnetic film is set to $\lambda s \leq -15 \times 10^{-6}$, hysteresis in a change of the magnetizaion of the magnetic domain control ferromagnetic film for the external magnetic field increases. This results in instability in the output of magnetoresistive element.

Description is made by referring to FIGS. 22 and 23. FIGS. 22 and 23 illustrate the relation between the external magnetic field H and the magnetization M produced in the magnetic domain control ferromagnetic film. In FIG. 22, Hex indicates an exchange anisotropy magnetic field obtained by exchange coupling of the magnetic domain control ferromagnetic film to the magnetic domain control antiferromagnetic film. Hc indicates a coercive force of the magnetic domain control ferromagnetic film.

In general, the external magnetic field H applied to the magnetic domain control ferromagnetic film is assumed to be about 0 with the magnetoresistive element reproducing.

As an example shown in FIG. 22, if Hex is negative value and have a small hysteresis, that is, the coercive force Hc is small and the external magnetic field H is about 0 (a region E), the magnetization M is always positive value M1. If Hex is positive value, the magnetization M is negative value M2 in the region E.

On the other hand, in an example shown in FIG. 23, if hysteresis is large in a change of the magnetization M, that is, the coercive force Hc is large and the external magnetic field H is about 0 (the region E), the magnetization M of the magnetic domain control ferromagnetic film can take two values (M1 and M2). Namely, the magnetic domain control ferromagnetic film may change into either M1 or M2. As a result, the bias magnetization applied to the free layer may change into two values of M1 or M2 and thus the output of magnetic transducer may vary.

SUMMARY OF THE INVENTION

The present invention is designed to overcome the foregoing problems. It is an object of the invention to provide a magnetic transducer capable of suppressing a variation in output and obtaining an appropriate bias magnetic field, a thin film magnetic head, and a method of manufacturing the same.

A magnetic transducer of the present invention comprising a magneto-sensitive layer detecting an external magnetic field and a magnetic domain control film applying a bias magnetic field to the magneto-sensitive layer, the magnetic domain control film includes: a magnetic domain control ferromagnetic film made of a ferromagnetic material; and a magnetic domain control magnetization fix film for fixing the orientation of the magnetization of the magnetic domain control ferromagnetic film, wherein the magnetostriction $\lambda s$ of the magnetic domain control ferromagnetic film is within a range of $-15 \times 10^{-6} < \lambda s < 0$.

In a magnetic transducer of the invention, the magnetostriction $\lambda s$ of the magnetic domain control ferromagnetic film is within a range of $-15 \times 10^{-6} < \lambda s < 0$ so that hysteresis in a change of the magnetization of the magnetic domain control ferromagnetic film to an external magnetic field is relatively small. The magnetic domain control ferromagnetic film always shows a constant magnetization, that is, never has a plurality of magnetizations in operation of the magnetic transducer (for example, under an external magnetic field of about 0). As a result, the magnetic domain control film always applies the constant bias magnetic field to the magneto-sensitive layer and the output of the magneto-sensitive layer becomes stable.

In a magnetic transducer of the invention, the magnetic domain control ferromagnetic film may be made of NiFe containing within a range of 82 to 90% by weight of Ni. In the magnetic domain control ferromagnetic film fabricated using NiFe of such composition, the magnetostriction $\lambda s$ of a range of $-15 \times 10^{-6} < \lambda s < 0$ can be obtained.

In a magnetic transducer of the invention, the magnetic domain control magnetization fix film may be made of an irregular base antiferromagnetic material. The irregular base antiferromagnetic material can induce an exchange anisotropy magnetic field to ferromagnetic materials without heat treatment. The magnetic domain control magnetization fix film made of an irregular base antiferromagnetic material induces an exchange anisotropy magnetic field on an interface between the magnetic domain control ferromagnetic film and the magnetic domain control magnetization fix film by stacking these two layers without heat treatment.

In a magnetic transducer of the invention, the magneto-sensitive layer may include a magneto-separative layer; a soft magnetic layer formed on one side of the magneto-separative layer, the orientation of magnetization of the soft magnetic layer being freely changed by an external magnetic field; a ferromagnetic layer formed on the other side of the magneto-separative layer; and an antiferromagnetic layer formed on the ferromagnetic layer on the side opposite to the magneto-separative layer.

In a magnetic transducer of the invention, a stack pattern includes the ferromagnetic layer, the magneto-separative layer and the soft magnetic layer may be formed on the antiferromagnetic layer and the magnetic domain control film may be formed laterally adjacent to the stack pattern on the antiferromagnetic layer. The contact area of the magneto-sensitive layer and the magnetic domain control film (only the contact area between the antiferromagnetic layer and the magnetic domain control film) is widened by forming the magnetic domain control film on the antiferromagnetic layer of the magneto-sensitive layer. Consequently, electrical contact resistance between the magneto-sensitive layer and the magnetic domain control film is reduced.

A thin film magnetic head of the invention comprises a magnetic transducer having a magneto-sensitive layer detecting an external magnetic field and a magnetic domain control film applying a bias magnetic field to the magneto-sensitive layer and the magnetic transducer may have any of the structure described above.

A method of manufacturing a magnetic transducer of the invention includes the steps of: stacking an antiferromagnetic layer, a ferromagnetic layer, a magneto-separative layer and a soft magnetic layer on a substrate in the order named; patterning the ferromagnetic layer, the magneto-separative layer and a soft magnetic layer to form a stack pattern including these three layers; and forming a magnetic domain control film including a magnetic film having the magnetostriction λs within a range of $-15 \times 10^{-6} < \lambda s < 0$, laterally adjacent to the stack pattern on the antiferromagnetic layer. In this method, the structure that the stack pattern consisted of the ferromagnetic layer, the magneto-separative layer and the soft magnetic layer and the magnetic domain control film are formed on the antiferromagnetic layer.

In a method of manufacturing a thin film head of the invention, a thin film magnetic head comprises a magnetic transducer having a magneto-sensitive layer detecting an external magnetic field and a magnetic domain control film applying a bias magnetic field to the magneto-sensitive layer formed by the steps of: stacking an antiferromagnetic layer, a ferromagnetic layer, a magneto-separative layer and a soft magnetic layer on a substrate in the order named; patterning the ferromagnetic layer, the magneto-separative layer and a soft magnetic layer to form a stack pattern including these three layers; and forming a magnetic domain control film including a magnetic film having the magnetostriction λs within a range of $-15 \times 10^{-6} < \lambda s < 0$, laterally adjacent to the stack pattern on the antiferromagnetic layer.

Other and further objects, features and advantages of the invention will appear more fully from the following description.

DETAILED DESCRIPTION OF THE PREFERRED EMBODIMENTS

Embodiments of the invention will be described in detail below with reference to the accompanying drawings.

Configuration of MR Element and Composite Head

An MR element as a magnetic transducer according to a embodiment of the invention and a composite head as a thin film magnetic head using the same will be described with reference to FIGS. 1 to 3.

Figure 2:
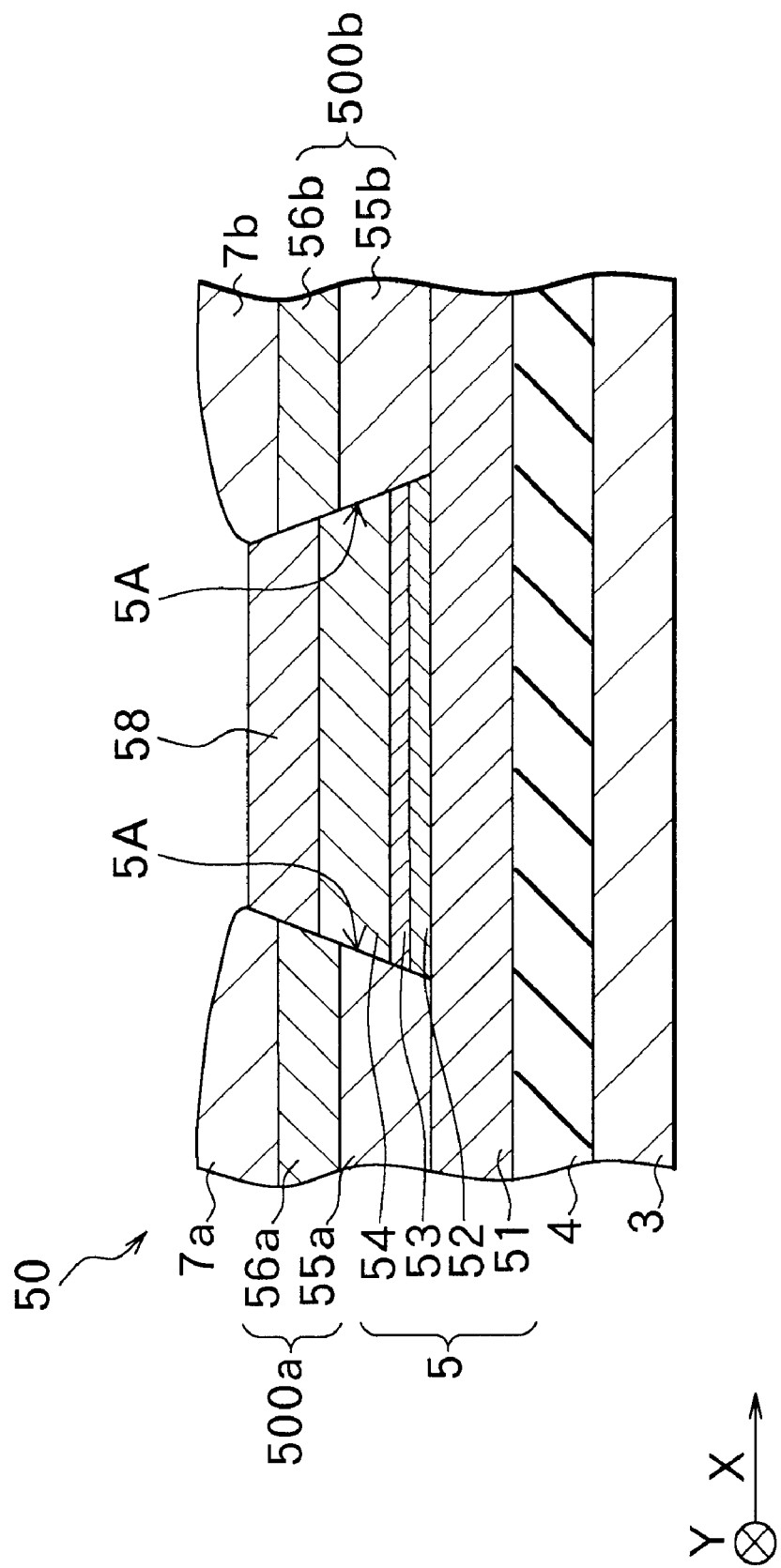
FIG. 2 is a sectional view parallel to a medium-facing surface of the MR element of the composite head shown in FIG. 1.
Figure 3:
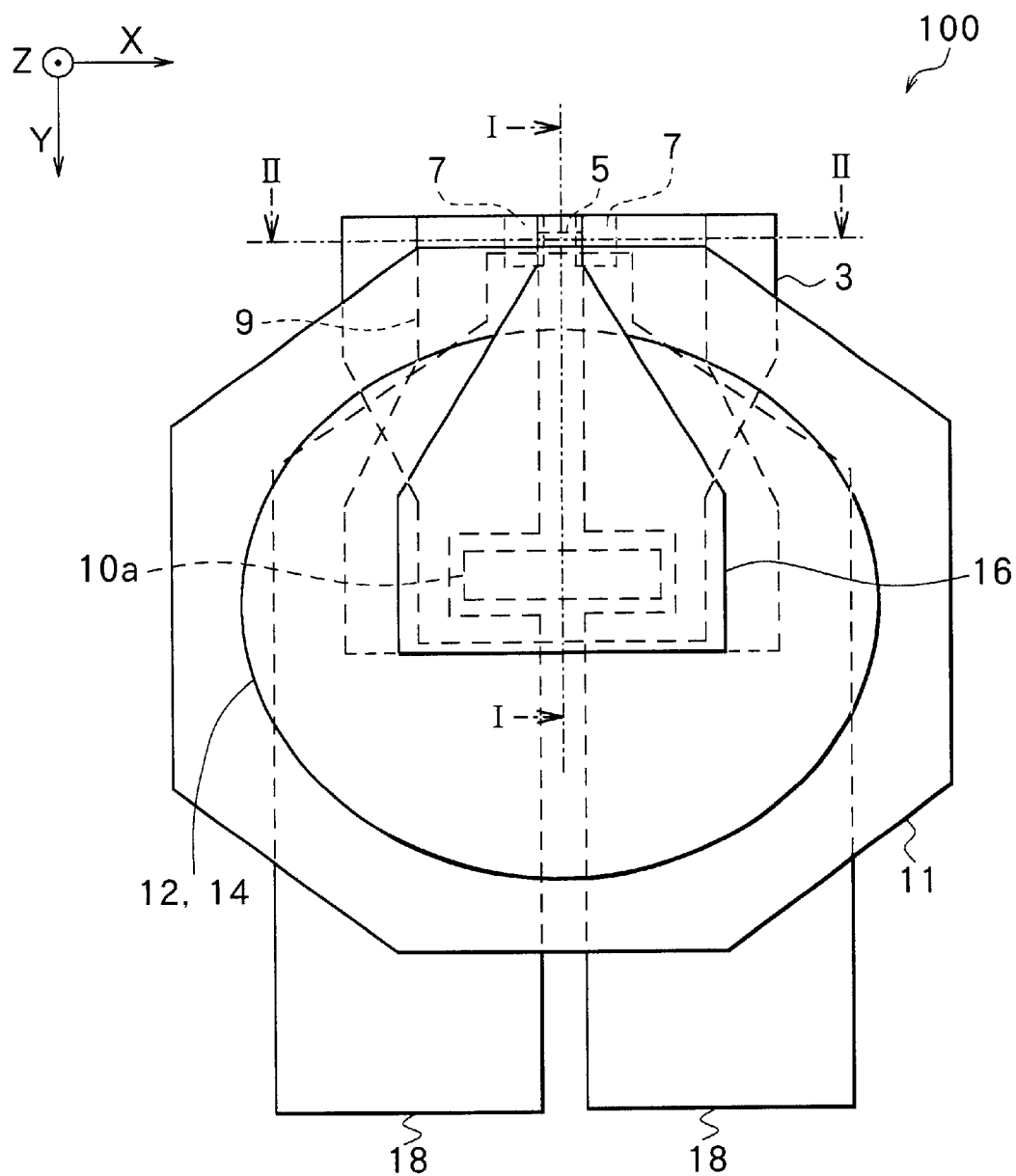
FIG. 3 is a plan view of the composite head of the embodiment of the invention.

FIG. 3 illustrates a plan view of the basic configuration of a composite head 100 of the embodiment. FIGS. 1 and 2 illustrate sectional views taken along line I—I and line II—II in FIG. 3. As illustrated in FIG. 1, the composite head 100 is consisted of a recording head 101 for recording information on magnetic recording media such as hard disk and a reproducing head 102 for reproducing information on magnetic recording media. The one end face of the composite head 100 (the left end face in FIG. 1) is the medium-facing surface (or air bearing surface; ABS) S opposite to a magnetic recording medium.

Figure 1:
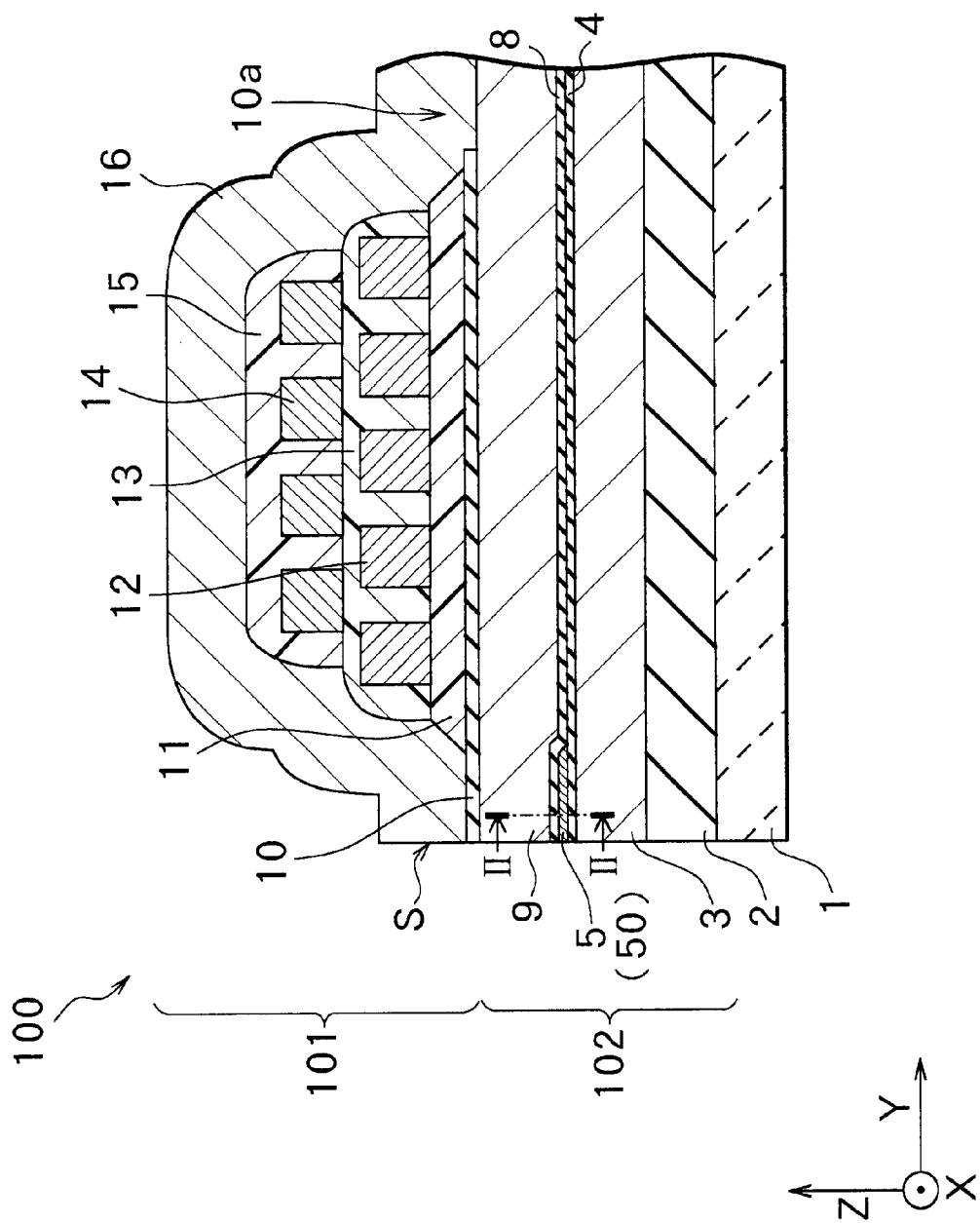
FIG. 1 is a sectional view perpendicular to a medium-facing surface of the composite head of the embodiment of the invention.

An arrow Z indicates the direction of movement of the magnetic recording medium and an arrow X indicates the direction of track width of the magnetic recording medium, that is, the direction of reproducing track width of the composite head in FIGS. 1 to 3. An arrow Y indicates the direction facing the magnetic recording medium and the composite head 100. The signal magnetic field from the magnetic recording medium corresponds to a specific example of the "external magnetic field" of the invention.

In FIG. 1, the composite head 100 has a substrate 1 made of, for example, $Al_2O_3 \cdot TiC$ (altic). On the substrate 1, an insulating layer 2 of 2 to 10 μm in film thickness made of, for example, $Al_2O_3$ (alumina) and a bottom shield layer 3 of 1 to 3 μm in film thickness made of a magnetic material such as NiFe (nickel-iron alloy: permalloy) are deposited. On the bottom shield layer 3, a bottom shield gap layer 4 and a top shield gap layer 8 of 10 to 100 μm in film thickness made of $Al_2O_3$ or AlN (aluminum nitride) are formed.

An MR element 50 (FIG. 2) including a stack 5 that is a spin valve film is buried between the bottom shield gap layer 4 and the top shield gap layer 8. On the top shield gap layer 8, a top shield-cum-bottom pole (hereinafter referred to as a top shield layer) 9 of 1 to 4 μm in film thickness made of a magnetic material such as NiFe used for both the reproducing head 102 and the recording head 101 is formed.

On the top shield layer 9, a write gap layer 10 of 0.1 to 0.5 μm in film thickness made of an insulating film such as $Al_2O_3$ is formed. On the write gap layer 10, a first-layer-thin film coil 12 (film thickness is 2 to 3 μm) for recording head and a photoresist layer 13 for covering the coil 12 are formed sandwiching a photoresist layer 11 of 1.0 to 5.0 μm in film thickness. On the photoresist layer 13, a second-layer-thin film coil 14 (film thickness is 2 to 3 μm) and a photoresist layer 15 for covering the coil 14 are formed. Although, an example of two-layer thin film coil is given in the embodiment, one or more than two layers of thin film coil is also acceptable.

A top pole 16 of about 3 μm film thick made of a magnetic material for recording head, for example, high-saturated flux density materials such as NiFe or FeN (iron nitride) is formed to cover the photoresist layers 11, 13 and 15. Although it is not shown in FIGS. 1 to 3, the top pole 16 is covered with an overcoat layer (a overcoat layer 17 in FIG. 13) of 20 to 30 μm film thick made of, for example, $Al_2O_3$.

The bottom shield layer 3, the bottom shield gap layer 4, the MR element 50, the top shield gap layer 8 and the top shield layer 9 form the reproducing head 102 for detecting information of a magnetic recording medium, that is, the signal magnetic field from the magnetic recording medium. The reproducing head 102 detects a change in electric resistance generated in the stack 5 by the signal magnetic field from the magnetic recording medium.

The top magnetic shield portion (serve as a bottom pole) 9, the write gap layer 10, the coils 12 and 14 and the top pole 16 form the recording head 101 for recording information on a magnetic recording medium. The recording head 101 produces magnetic flux to the top pole 16 and the bottom pole 9 by current passing through the coils 12 and 14 and magnetize the magnetic layer of the magnetic recording medium by magnetic flux produced around the write gap layer 10 between the top pole 16 and the bottom pole 9.

As illustrated in FIG. 2, the MR element 50 of the embodiment comprises the stack 5 which stacks an antiferromagnetic layer 51 made of, for example, PtMn (platinum-manganese), a pinned layer 52 which is a magnetic layer made of, for example, Co (cobalt), a nonmagnetic metal layer 53 made of, for example, Cu (copper), and a free layer 54 made of, for example, NiFe in the order named on the bottom shield gap layer 4. The top surface of the free layer 54 is covered with a protective layer 58 made of, for example, Cu.

Application of heat treatment at a temperature of 250° C., for instance, with the pinned layer 52 and the antiferromagnetic layer 51 stacked, fixes the orientation of the magnetization of the pinned layer 52 by exchange coupling on an interface between the pinned layer 52 and the antiferromagnetic layer 51. In the embodiment, the orientation of the magnetization of the pinned layer 52 is fixed in the direction Y in FIG. 2.

The surface of the antiferromagnetic layer 51 of the stack 5 is wider than each surface of the pinned layer 52, the nonmagnetic metal layer 53 and the free layer 54. The pinned layer 52, the nonmagnetic metal layer 53 and the free layer 54 are formed with selectively patterned on the center of the antiferromagnetic layer 51 (in the direction of reproducing track width). In the stack 5 of the embodiment, the end face of the stack pattern consisted of the pinned layer 52, the nonmagnetic metal layer 53 and the free layer 54 in the direction of reproducing track width becomes a taper face 5A inclined to the direction of the stack.

Specific examples of the present invention are as follows. The stack 5 corresponds to the "magneto-sensitive layer". The antiferromagnetic layer 51 corresponds to the "antiferromagnetic layer" and the pinned layer 52 corresponds to the "ferromagnetic layer". The nonmagnetic metal layer 53 corresponds to the "magnetic separation layer" and the free layer 54 corresponds to the "soft magnetic layer". The stack pattern consisted of the pinned layer 52, the nonmagnetic metal layer 53 and the free layer 54 corresponds to the "stack pattern".

On the antiferromagnetic layer 51, magnetic domain control films 500a and 500b are provided sandwiching the stack pattern consisted of the pinned layer 52, the nonmagnetic metal layer 53 and the free layer 54 in the direction of reproducing track width. The magnetic domain control films 500a and 500b are provided to suppress Barkhausen noise by aligning the orientation of the magnetization of the free layer 54, that is, magnetize in single magnetic domain. The magnetic domain control films 500a and 500b are consisted of two layers; one is magnetic domain control ferromagnetic films 55a and 55b and the other is magnetic domain control antiferromagnetic films 56a and 56b deposited thereon. Exchange coupling on each interface between the magnetic domain control ferromagnetic film 55a and the magnetic domain control antiferromagnetic film 56a, and the magnetic domain control ferromagnetic film 55b and the magnetic domain control antiferromagnetic film 56b fixes the orientation of the magnetization of the magnetic domain control ferromagnetic films 55a and 55b, and thus a bias magnetic field to the free layer 54 is produced.

The magnetic domain control ferromagnetic films 55a and 55b are made of a ferromagnetic material having magnetostriction λs within a range of $-15 \times 10^{-6} < \lambda s < 0$. The magnetic domain control ferromagnetic films 55a and 55b having such a magnetostriction λs is made of NiFe (nickel-iron alloy: permalloy) containing within a range of 82 to 90% by weight of Ni (nickel). For example, if the magnetic domain control ferromagnetic films 55a and 55b are made of NiFe containing Ni by 85wt %, the magnetostriction λs is $-2 \times 10^{-6}$. Incidentally, the magnetostriction As is $-3 \times 10^{-6}$ in the case of NiFe containing Ni by 86 wt %.

The magnetic domain control antiferromagnetic films 56a and 56b are made of an irregular base antiferromagnetic material such as FeMn (iron-manganese alloy). The irregular base antiferromagnetic material can induce an exchange anisotropy magnetic field with a ferromagnetic material without heat treatment.

The magnetic domain control ferromagnetic films 55a and 55b may be made of NiFeCo (nickel-iron-cobalt alloy), CoFe (cobalt-iron alloy), Fe or the like in addition to NiFe mentioned above. The magnetic domain control antiferromagnetic films 56a and 56b may be made of an Mn base material expressed by XMn (X denotes Ir, Rh, Ru, Ni, Pt, Cr and so on) or an oxide material such as NiO (nickel oxide), CoO (cobalt oxide), $Fe_2O_3$ (iron sesquioxide) or the like.

The magnetic domain control films 500a and 500b correspond to a specific example of the "magnetic domain control film" of the invention. The magnetic domain control ferromagnetic films 55a and 55b correspond to a specific example of the "magnetic domain control ferromagnetic film" of the invention and the magnetic domain control antiferromagnetic films 56a and 56b correspond to a specific example of the "magnetic domain control magnetization fix film" of the invention.

Operation of MR Element and Composite Head

Next, the operation (reproducing) of the MR element 50 and the composite head 100 of such a configuration will be described with reference to FIGS. 4 to 6.

Figure 4:
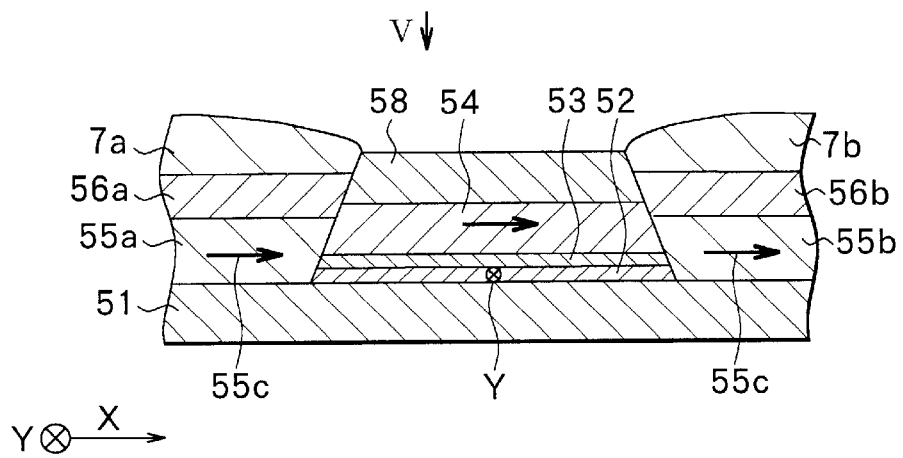
FIG. 4 is a schematic view of a state of producing a bias magnetic field of the MR element shown in FIG. 2.

FIG. 4 illustrates the cross section of the MR element 5 as in FIG. 2 and shows the orientation of the magnetization of a magnetic domain control film and a bias magnetic field of the free layer schematically. The orientation of the magnetization of the pinned layer 52 is fixed in the direction Y in the drawing by an exchange anisotropy magnetic field produced by exchange coupling on an interface between the pinned layer 52 and the antiferromagnetic layer 51. The orientation of the magnetization of the magnetic domain control ferromagnetic films 55a and 55b is fixed in the direction indicated by an arrow 55c by the exchange anisotropy magnetic field Hex (FIG. 6) induced by exchange coupling on each interface between the magnetic domain control ferromagnetic film 55a and the magnetic domain control antiferromagnetic films 56a of the magnetic domain control film 500a, and the magnetic domain control ferromagnetic film 55b and the magnetic domain control antiferromagnetic films 56b of the magnetic domain control film 500b. A bias magnetic field 54c is applied to the free layer 54 by the magnetic domain control ferromagnetic films 55a and 55b. The orientations of the bias magnetic field 54c of the free layer 54 and of the magnetization of the pinned layer 52 orthogonalize each other.

A detecting current (sense current) as a constant current is fed through the pinned layer 52, the nonmagnetic metal layer 53 and the free layer 54 through lead layers 7a and 7b in the direction parallel to the bias magnetic field 54c. Receiving the signal magnetic field from a magnetic recording medium, the direction of the magnetization of the free layer 54 is changed. The current passing through the free layer 54 is subjected to the resistance in accordance with a relative angle between the orientation of the magnetization of the free layer 54 and the fixed orientation of the magnetization of the pinned layer 52 and the resistance is detected as a voltage.

Next, the relation of a variation in output between magnetostriction $\lambda s$ of the magnetic domain control ferromagnetic films 55a and 55b and the composite head 100 will be described.

Figure 5:
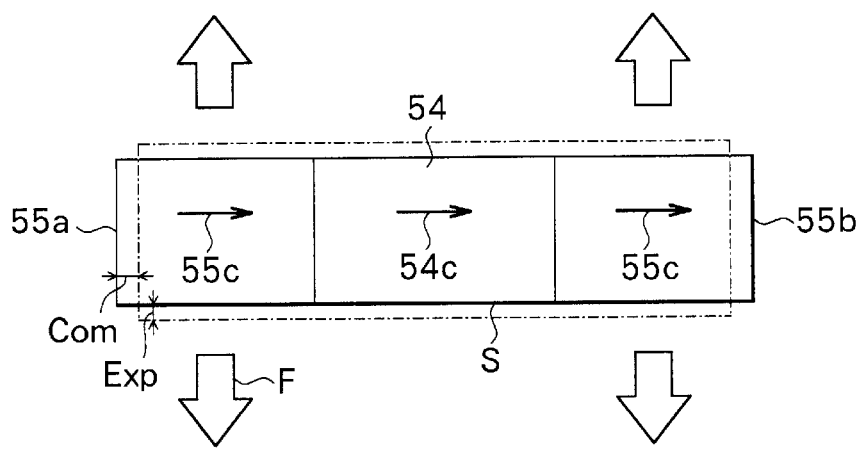
FIG. 5 is a view illustrates the orientation of the magnetization of each part of the MR element shown in FIG. 2.

FIG. 5 illustrates the orientation of the magnetization of the magnetic domain control ferromagnetic films 55a and 55b and the bias magnetic field of the free layer 54 as seen from above of the MR element 50 (the direction indicated by an arrow V in FIG. 4). When the shield layers 3 and 9 (FIG. 1) are overlaid on the MR element 50 to make the reproducing head, the tensile stress F is applied to the MR element 50 in the direction orthogonal to the medium-facing surface S. At this time, tensile strain (strain in the direction of the expansion Exp) parallel to the tensile stress F and compression strain (strain in the direction of the compression Com) perpendicular to the tensile stress F are developed in the magnetic domain control ferromagnetic films 55a and 55b. If the magnetostriction $\lambda s$ of the magnetic domain control ferromagnetic films 55a and 55b is positive, the orientation of magnetization changes because the magnetization thereof may orient the same direction as the tensile strain. This weakens the bias magnetic field applied to the free layer 54.

In contrast, the magnetostriction $\lambda s$ of the magnetic domain control ferromagnetic films 55a and 55b is negative in the embodiment, so that the magnetization of the magnetic domain control ferromagnetic films 55a and 55b may orient the same direction as the compression strain. Since the compression strain and the bias magnetic field are parallel to each other, the orientation of magnetization is unchanged in the magnetic domain control ferromagnetic films 55a and 55b. Accordingly, the bias magnetic field 54c of the free layer 54 is not weakened.

Figure 6:
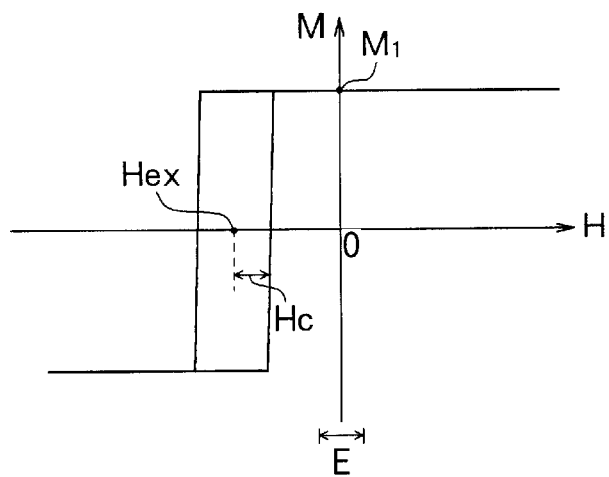
FIG. 6 is a view illustrates the relation of each part of the MR element shown in FIG. 2 and an external magnetic field.

FIG. 6 illustrates the relation of the external magnetic field H and the magnetization M produced in the magnetic domain control ferromagnetic films 55a and 55b. In FIG. 6, Hex is exchange anisotropy magnetic field obtained by exchange coupling of the magnetic domain control ferromagnetic to the magnetic domain control antiferromagnetic film. During the operation of the composite head 100, the external magnetic field H applied to the magnetic domain control ferromagnetic films 55a and 55b is assumed to be about 0.

In general, the greater the absolute value of magnetostriction $\lambda s$ is, the greater the coercive force Hc. As a result, hysteresis in a change of the magnetization M is large. If hysteresis is large and the external magnetic field H is about 0 (the region E), the magnetization M of the magnetic domain control ferromagnetic film can take two values (M1 and M2). Namely, the magnetic domain control ferromagnetic film may change into either M1 or M2. As a result, the bias magnetization applied to the free layer may change into two values of M1 or M2 and thus the output of magnetic transducer may vary.

In the embodiment, however, the magnetostriction $\lambda s$ is set to $-15 \times 10^{-6} < \lambda s < 0$ and the absolute value of the magnetostriction $\lambda s$ is smaller than $-15 \times 10^{-6}$. This precludes hysteresis in a change of the magnetization M from being large. That is, as illustrated in FIG. 6, if the external magnetic field H is about 0 (the region E), the magnetization M of the magnetic domain control ferromagnetic films 55a and 55b always shows the constant value M1. As a result, the constant bias magnetic field is always applied to the free layer. This enables the stable reproducing output of the composite head 100.

Figure 7:
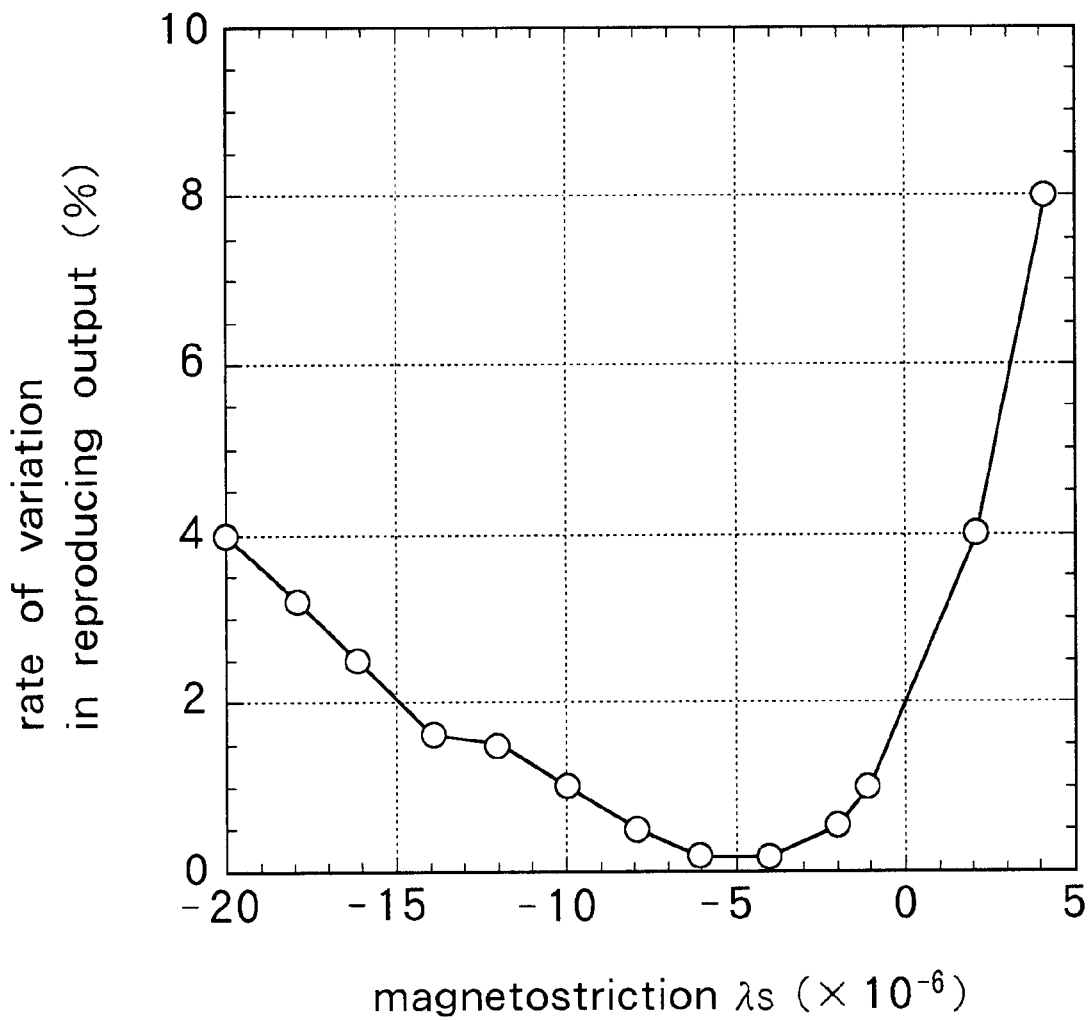
FIG. 7 is a view illustrates the relation of the magnetostriction of the magnetic domain control ferromagnetic film and the variation in output of the embodiment of the invention.

FIG. 7 illustrates the relation of the magnetostriction of the magnetic domain control ferromagnetic films 55a and 55b and the rate of variation in reproducing output of the composite head 100. Many kinds of magnetic domain control ferromagnetic films having different magnetostriction $\lambda s$ are prepared by changing the composition of NiFe (film thickness is 20 nm) forming the magnetic domain control ferromagnetic films. The magnetic domain control antiferromagnetic film is formed of RuRhMn (ruthenium-rhodium-manganese) and has a film thickness of 15 nm. The constant external magnetic field from a magnetic recording medium or the like is applied to the composite head 100 and the rate of variation in reproducing output thereof is examined.

As a result, as shown in FIG. 7, if the magnetostriction $\lambda s$ of the magnetic domain control ferromagnetic films 55a and 55b is within a range of $-15 \times 10^{-6} < \lambda s < 0$, the rate of variation in reproducing output is equal or less than 2%. This is generally required substantial standard value of the rate of variation of reproducing properties.

Moreover, if the magnetostriction $\lambda s$ is within a range of $-10 \times 10^{-6} < \lambda s < -1 \times 10^{-6}$, the rate of variation in reproducing output is equal or less than 1%. Furthermore, if the magnetostriction $\lambda s$ is within a range of $-8 \times 10^{-6} < \lambda s < -2 \times 10^{-6}$, the rate of variation in reproducing output is equal or less than 0.5%.

A Method of Manufacturing a Composite Head

A method of manufacturing the composite head 100 will be described with reference to the FIGS. 8 to 18. FIGS. 8 to 13 illustrate sectional views perpendicular to the medium-facing surface S of the composite head 100 (that is, the section I—I in FIG. 3). FIGS. 14 to 18 illustrate magnified sectional views parallel to the medium-facing surface of the composite head (that is, the section II—II in FIG. 3).

Figure 8:
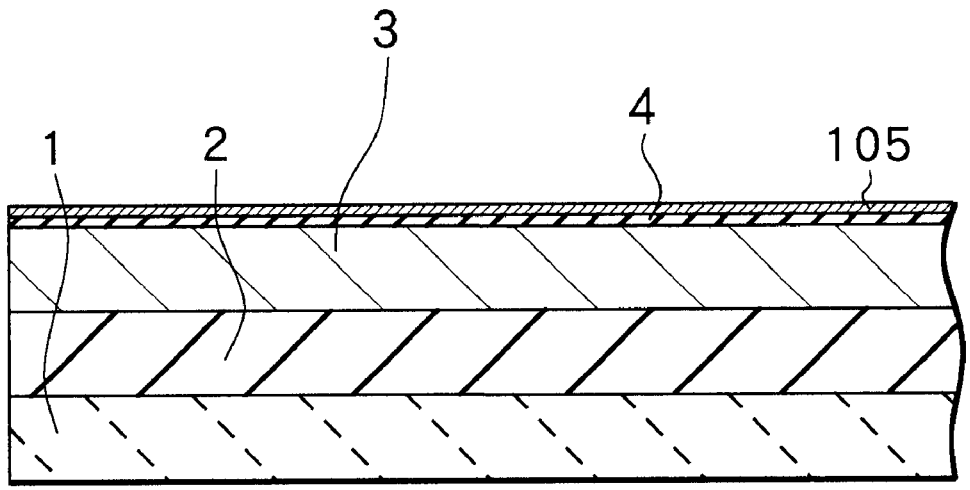
FIG. 8 is a sectional view for describing a step of a method of manufacturing the composite head of the embodiment of the invention.

In the method of manufacturing of the embodiment, first, as illustrated in FIG. 8, an insulating layer 2 made of, for example, $Al_2O_3$ (alumina) is deposited on the substrate 1 made of, for example, $Al_2O_3$.) TiC (altic) in a film thickness of about 2 to 10 μm.

On the insulating layer 2, the bottom shield layer 3 for reproducing head made of a magnetic material is formed in a film thickness of 1 to 3 μm by, for example, plating. On the bottom shield layer 3, $Al_2O_3$ or AlN is sputter-deposited in 10 to 100 μm film thick to form the bottom shield gap layer 4 as an insulating layer.

On the bottom shield gap layer 4, a stack film 105 for forming the stack 5 is formed in a few nanometers film thick. Specifically, as shown in magnified FIG. 14, on the bottom shield gap layer 4, the antiferromagnetic layer 51, the pinned layer 52, the nonmagnetic metal layer 53, the free layer 54 and the protective layer 58 are stacked in the order named by sputtering to form the stack film 105.

Figure 14:
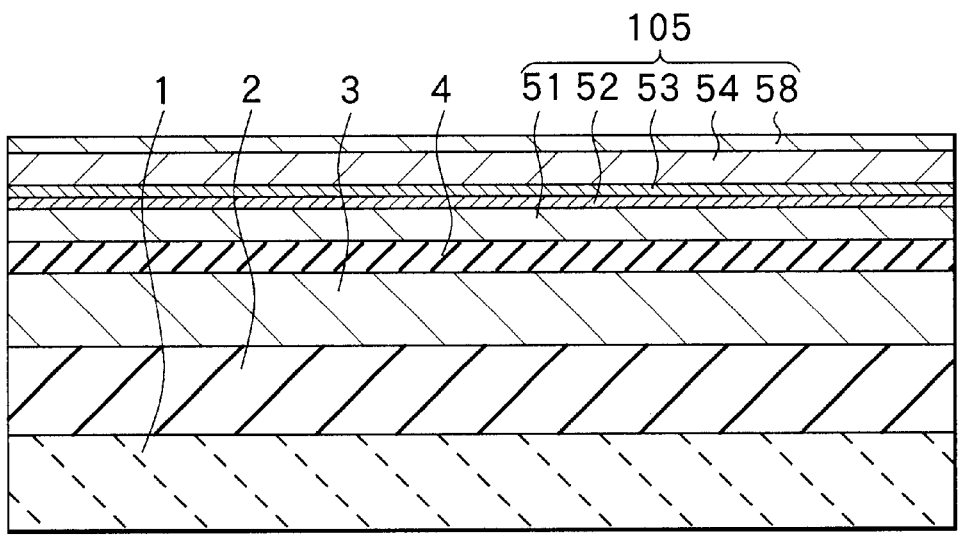
FIG. 14 is a sectional view for describing a step of a method of manufacturing the composite head of the embodiment of the invention and a magnified view of section parallel to a medium-facing surface.

The antiferromagnetic layer 51 is formed of an antiferromagnetic material having a regular crystal structure such as PtMn or the like to a film thickness of about 20 nm. The pinned layer 52 is formed of, for example, Co or the like to a film thickness of about 2 nm. The nonmagnetic metal layer 53 is formed of, for example, Cu or the like to a film thickness of about 2.5 nm. The free layer 54 is formed of, for example, NiFe or the like to a film thickness of about 8 nm. In FIG. 14, each film thickness of the antiferromagnetic layer 51, the pinned layer 52, the nonmagnetic metal layer 53 and the free layer 54 is illustrated thicker than that of other layers.

The material of the antiferromagnetic layer 51 can be selected from PtMn having a composition of 47 to 52 wt % Pt and 48 to 53 wt % Mn (most preferably, 48 wt % Pt and 52 wt % Mn), PtMnRh having a composition of 33 to 52 wt % Pt, 45 to 57 wt % Mn and 0 to 17 wt % Rh (most preferably, 40 wt % Pt, 51 wt % Mn and 9 wt % Rh), and RuRhMn having a composition of 0 to 20 wt % Ru, 0 to 20 wt % Rh, and 75 to 85 wt % Mn (most preferably, 3 wt % Ru, 15 wt % Rh, 82 wt % Mn).

The protective layer 58 is formed of one material either single layer film selected from Cu, Al, Rh (rhodium), Ru (ruthenium), Pt, RuRhMn, PtMn (platinum-manganese), PtMnRh (platinum-manganese-rhodium) and TiW (titanium-tungsten) or two layered film selected from Ta/PtMn, Ta/Cu, Ta/Al, Ta/Ru, TiW/Cu, TiW/Rh and TiW/Ru (the "/" between elements denotes the stack of elements).

Figure 9:
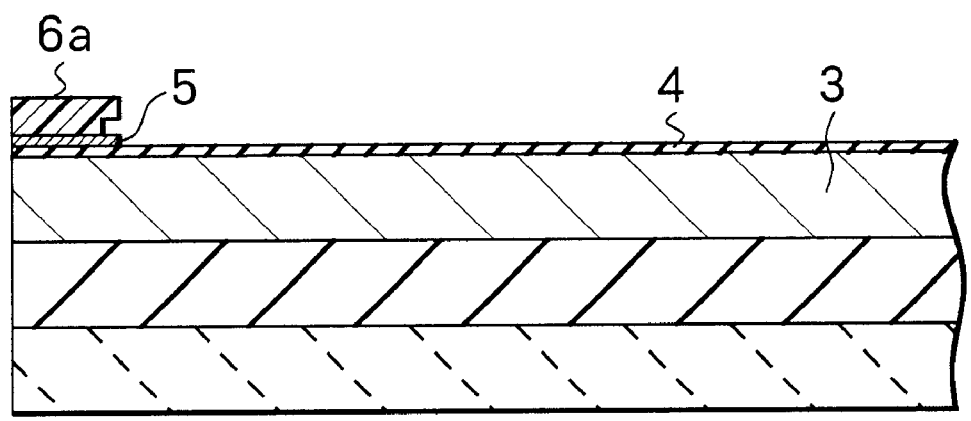
FIG. 9 is a sectional view for describing the step continued from FIG. 8.
Figure 15:
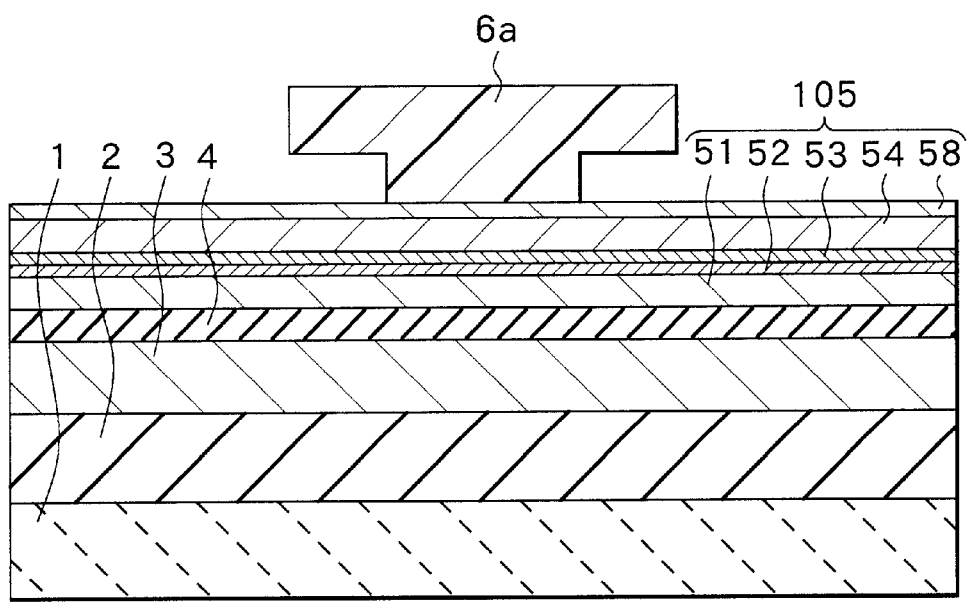
FIG. 15 is a magnified sectional view for describing the step continued from FIG. 14.

As illustrated in FIGS. 9 and 15, a photoresist pattern 6a is selectively formed on the stack film 105 where the stack 5 is formed. At this time, the photoresist pattern 6a has, for example, T shaped section to make later-described lift-off easier.

Figure 16:
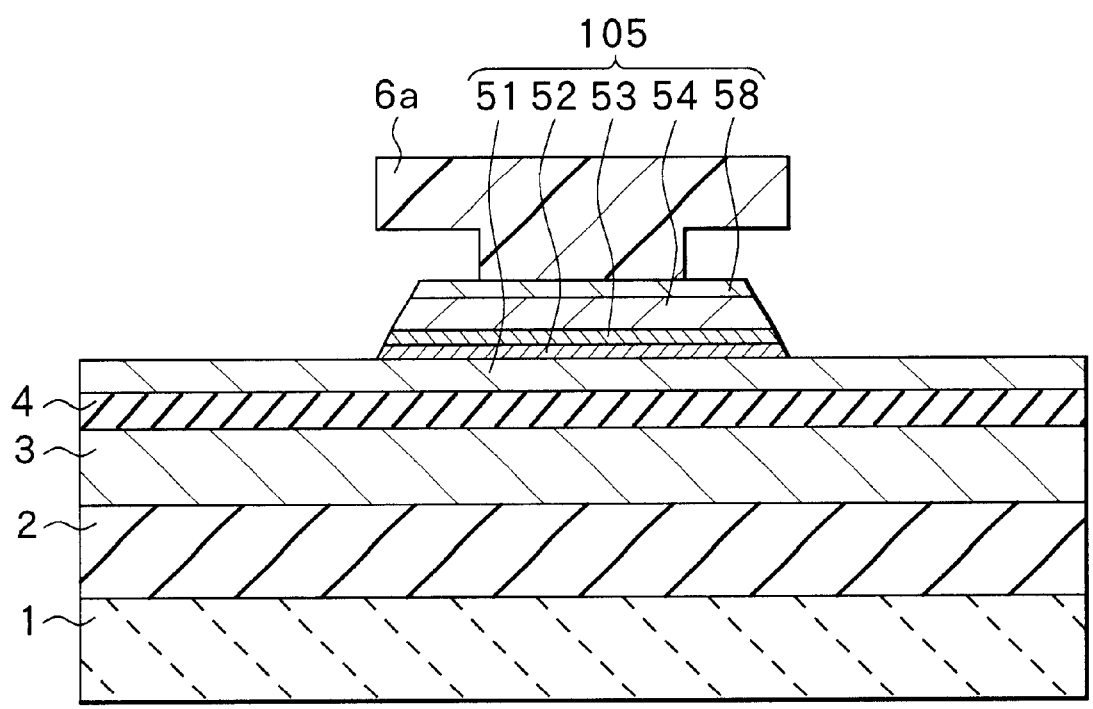
FIG. 16 is a magnified sectional view for describing the step continued from FIG. 15.

As illustrated in FIG. 16, using the photoresist pattern 6a as a mask, the stack 5 is formed by etching the stack film 105 by ion milling using, for example, Ar (argon) or the like. At this time, the etching depth needs to be set not to reach the antiferromagnetic layer 51 and thus a pattern consisted of the pinned layer 52, the nonmagnetic metal layer 53, the free layer 54 and the protective layer 58 is formed on the antiferromagnetic layer 51.

Figure 17:
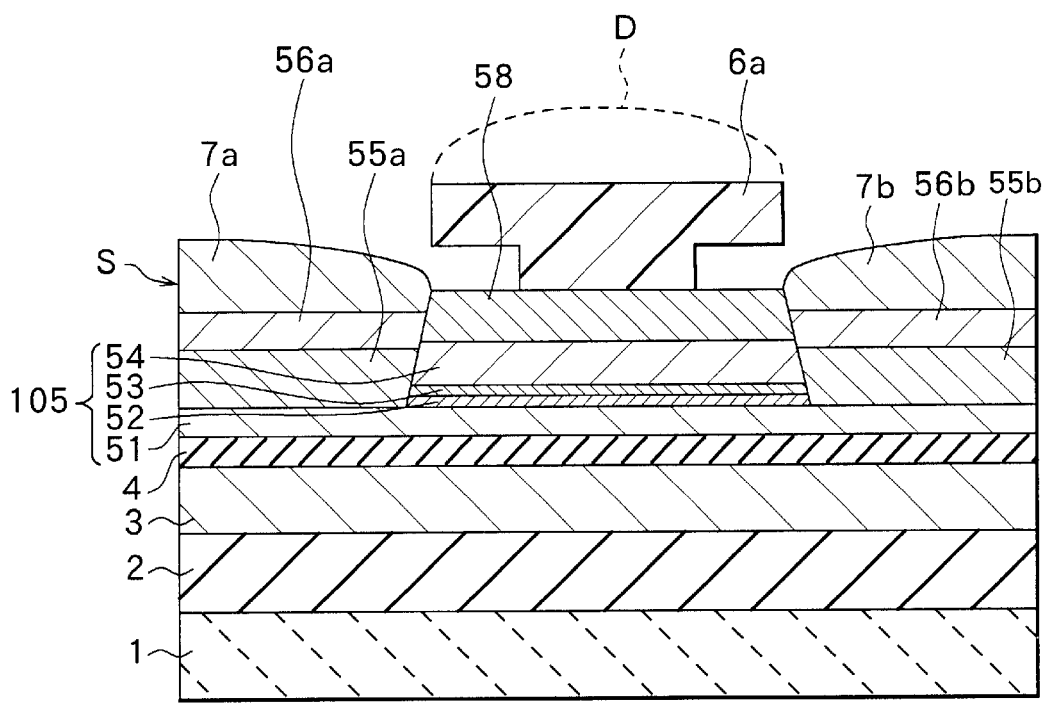
FIG. 17 is a magnified sectional view for describing the step continued from FIG. 16.

As illustrated in FIG. 17, on the antiferromagnetic layer 51, the magnetic domain control ferromagnetic films 55a and 55b are formed to sandwich the three layers; the pinned layer 52, the nonmagnetic metal layer 53 and the free layer 54. On the magnetic domain control ferromagnetic films 55a and 55b, the magnetic domain control antiferromagnetic films 56a and 56b are formed, respectively.

The magnetic domain control ferromagnetic films 55a and 55b are made of, for example, NiFe containing within a range of 82 to 90% by weight of Ni with a film thickness of about 20 nm, for instance. The magnetostriction λs of the magnetic domain control ferromagnetic films 55a and 55b formed in such method is set to $-15\times10^{-6}<\lambda s<0$. The magnetic domain control antiferromagnetic films 56a and 56b are made of an irregular base antiferromagnetic material such as FeMn with a film thickness of about 15 nm, for instance.

Further, on the magnetic domain control antiferromagnetic films 56a and 56b, the lead layers 7a and 7b are formed in a film thickness in the order of 100 to 200 nm. The lead layers 7a and 7b are formed as the stack films of Ta (tantalum) and Au (gold), Ti . W (titanium . tungsten alloy) and Co . Pt (cobalt . platinum alloy), or TiN (titanium nitride) and Co . Pt.

Subsequently, the photoresist pattern 6a and a deposit D (each material of the magnetic domain control ferromagnetic films, the magnetic domain control antiferromagnetic films and the lead layers) stacked thereon are removed by lift-off.

Figure 10:
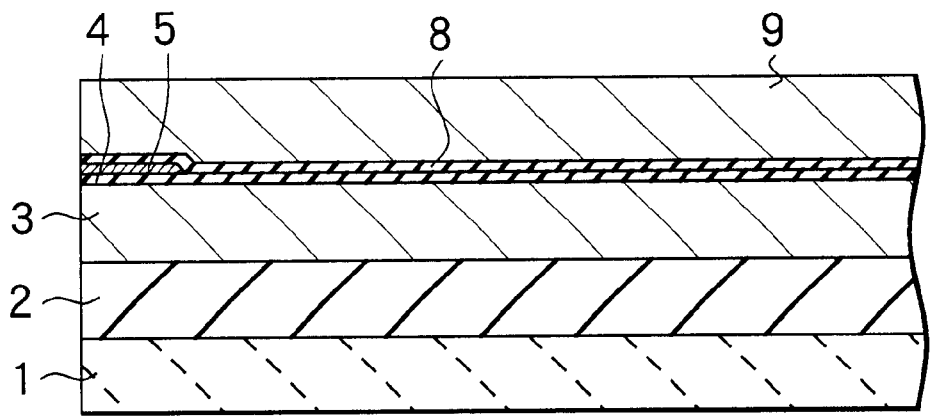
FIG. 10 is a sectional view for describing the step continued from FIG. 9.
Figure 18:
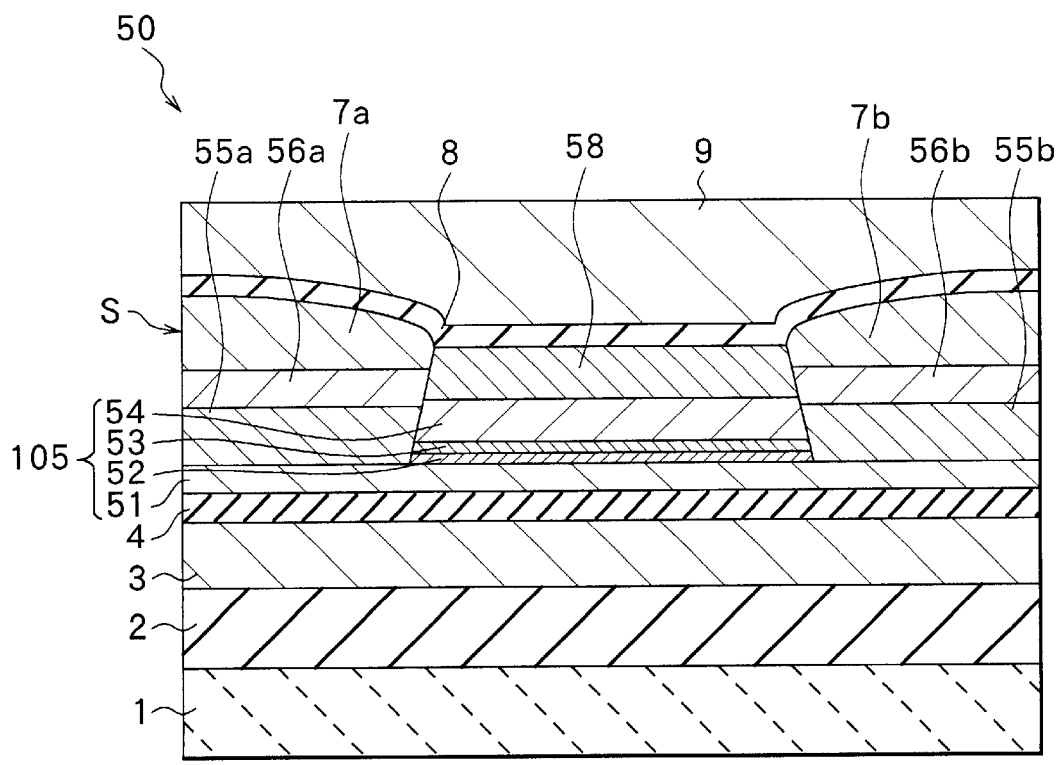
FIG. 18 is a magnified sectional view for describing the step continued from FIG. 17.

As illustrated in FIGS. 10 and 18, the top shield gap layer 8 made of an insulating film such as AlN is formed in a film thickness in the order of 50 to 100 nm to cover the bottom shield gap layer 4 and the stack 5 and the stack 5 is buried in the shield gap layers 4 and 8.

On the top shield gap layer 8, the top shield layer 9 made of a magnetic material and used for both reproducing and recording heads is then formed in a film thickness of about 1 to 4 μm.

Figure 11:
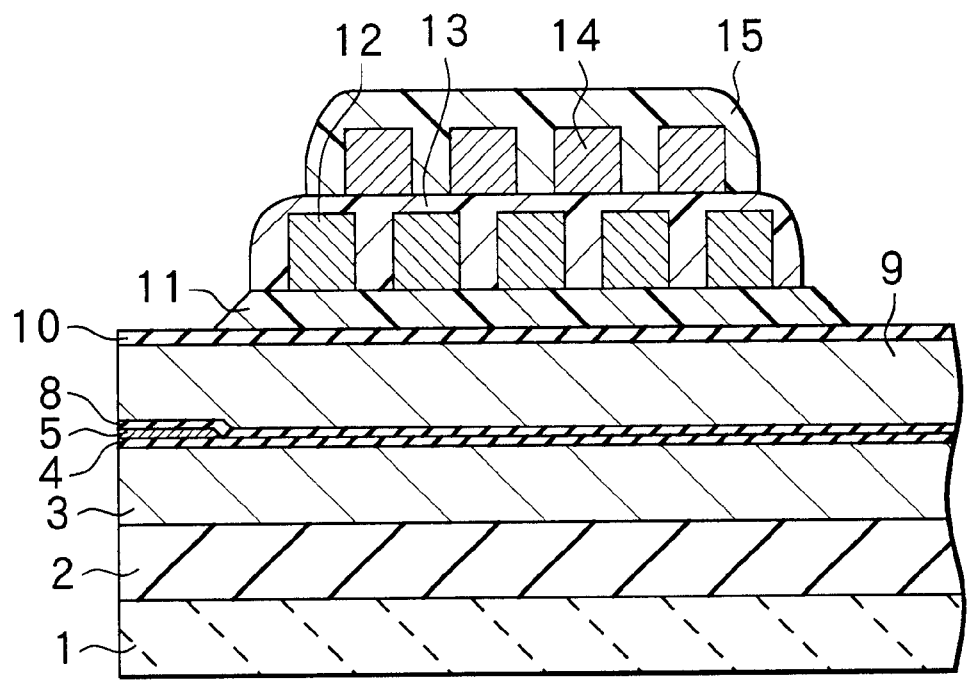
FIG. 11 is a sectional view for describing the step continued from FIG. 10.

As illustrated in FIG. 11, on the top shield layer 9, an insulating layer, for example, the write gap layer 10 made of alumina film is formed with 0.1 to 0.5 μm film thick. On the write gap layer 10, the photoresist layer 11 for determining the throat height is formed with about 1.0 to 2.0 μm film thick in a predetermined pattern. On the photoresist layer 11, a first-layer-thin film coil 12 for inductive type recording head is formed with 2 to 3 μm film thick. Subsequently, the photoresist layer 13 is formed in a predetermined pattern to cover the photoresist layer 11 and the thin film coil 12. On the photoresist layer 13, a second-layer-thin film coil 14 is formed with 2 to 3 μm film thick. Next, the photoresist layer 15 is formed in a predetermined pattern to cover the photoresist layer 13 and the thin film coil 14.

Figure 12:
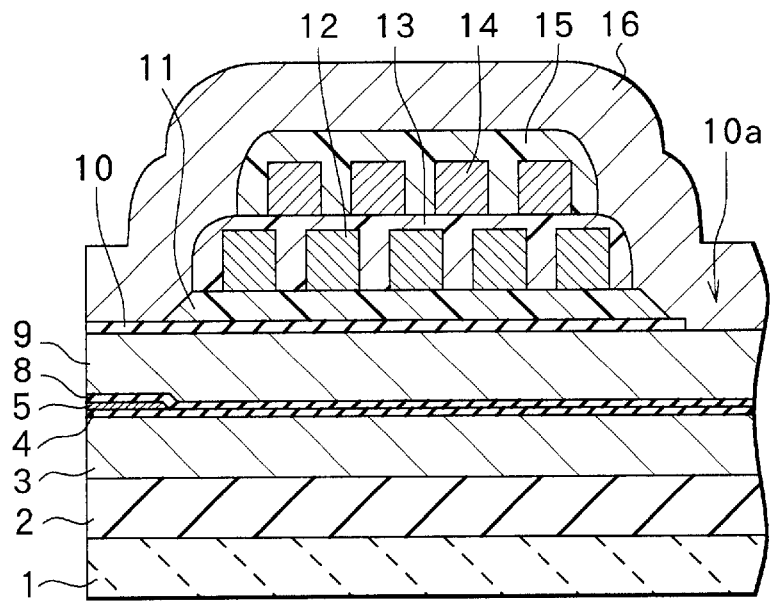
FIG. 12 is a sectional view for describing the step continued from FIG. 11.

As illustrated in FIG. 12, in the rear of the coils 12 and 14 (the right side in FIG. 14), the opening 10a is formed by partly etching the write gap layer 10 to form a magnetic path. The top pole 16 made of a magnetic material for recording heads, for example, high saturated flux density materials such as NiFe or FeN is then pattern-formed in a film thickness of about 3 μm to cover the write gap layer 10, the opening 10a and the photoresist layers 11, 13 and 15. The top pole 16 is in contact with and is magnetically coupled to the top shield layer (bottom pole) 9 in the opening 10a rear of the coils 12 and 14.

Figure 13:
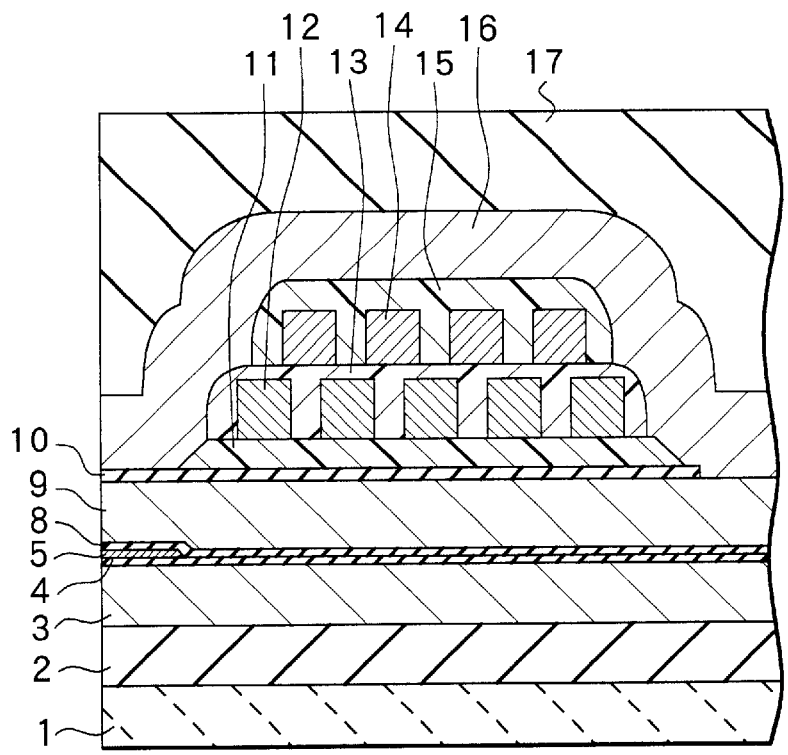
FIG. 13 is a sectional view for describing the step continued from FIG. 12.

As illustrated in FIG. 13, the write gap layer 10 and the top shield layer (bottom pole) 9 are etched by ion milling using the top pole 16 as a mask. On the top pole 16, the overcoat layer 17 made of, for example, alumina is formed in a film thickness of 20 to 30 μm.

Exchange coupling is induced on an interface between the antiferromagnetic layer 51 and the pinned layer 52 to fix (pinning) the orientation of the magnetic field of the pinned layer 52. Specifically, using a chamber with a magnetic field producing apparatus, the composite head 100 is heated to a blocking temperature (a possible temperature generating exchange coupling on interface) of the antiferromagnetic layer 51 and the pinned layer 52 to apply a magnetic field with a predetermined orientation of magnetization (the direction indicated by Y in FIGS. 1 or 2) to the pinned layer 52.

The material, PtMn or NiMn, used for the antiferromagnetic layer 51 of the embodiment comprises a CuAu.I type regular crystal structure and therefore the above-described heat treatment is required to induce exchange coupling. However, it is also possible to use an irregular type antiferromagnetic material such as FeMn as the antiferromagnetic layer 51 (like the magnetic domain control antiferromagnetic films 56a and 56b). In this case, the heat treatment for inducing exchange coupling can be omitted.

At last, machine the slider and form the air bearing surface of the recording and reproducing heads and then the composite head 100 is completed.

Effects According to the Embodiment

As described, according to the embodiment, the magnetostriction $\lambda s$ of the magnetic domain control ferromagnetic films 55a and 55b of the magnetic domain control films 500a and 500b is within a range of $-15 \times 10^{-6} < \lambda s < 0$. This suppresses hysteresis in a change of the magnetization of the magnetic domain control ferromagnetic films 55a and 55b. As a result, the bias magnetic field applied to the free layer becomes stable and the rate of variation in reproducing output is limited to equal or less than 2%.

The magnetic domain control ferromagnetic films 55a and 55b are made of NiFe containing within a range of 82 to 90% by weight of Ni. This enables the above-described magnetostriction $\lambda s$ of $-15 \times 10^{-6} < \lambda s < 0$.

The magnetic domain control ferromagnetic films 55a and 55b are formed of an irregular base antiferromagnetic material. This enables to induce exchange coupling on each interface between the magnetic domain control ferromagnetic film 55a and the magnetic domain control antiferromagnetic film 56a and the magnetic domain control ferromagnetic film 55b and the magnetic domain control antiferromagnetic film 56b without heat treatment. As a result, the magnetization of the pinned layer 52 of the stack 5 heat-treated for fixing the orientation of magnetization is unchanged during heat treatment for fixing the orientation of the magnetization of the magnetic domain control ferromagnetic films.

The rate of variation in reproducing output is limited to equal or less than 1% by setting the magnetostriction $\lambda s$ of the magnetic domain control ferromagnetic films 55a and 55b to $-10 \times 10^{-6} < \lambda s < -1 \times 10^{-6}$. In addition, the rate of variation in reproducing output is limited to equal or less than 0.5% by setting the magnetostriction $\lambda s$ of magnetic domain control ferromagnetic films 55a and 55b to $-8 \times 10^{-6} < \lambda s < -2 \times 10^{-6}$.

The magnetic domain control films 500a and 500b are formed on the antiferromagnetic layer 51 to sandwich the stack pattern consisted of the pinned layer 52, the nonmagnetic metal layer 53 and the free layer 54. As a result, the contact area of the stack 5 and the magnetic domain control films 500a and 500b (only the contact area of the antiferromagnetic layer 51 and the magnetic domain control films 500a and 500b) is widened and therefore the electrical contact resistance between the stack 5 and the magnetic domain control films 500a and 500b is reduced.

The taper 5A is formed in the end face of the stack pattern consisted of the pinned layer 52, the nonmagnetic metal layer 53 and the free layer 54. Compared to the perpendicular end face, the contact area of the stack 5 and the magnetic domain control films 500a and 500b is widened. This further reduces the electrical contact resistance.

Although the invention has been described by some embodiments, the invention is not limited to the foregoing embodiments but can be variously modified. For example, the magnetic domain control ferromagnetic films 55a and 55b and a hard magnet film may be stacked as the magnetic domain control film instead of stacking the magnetic domain control ferromagnetic films 55a and 55b and the magnetic domain control antiferromagnetic films 56a and 56b. In this case, CoPt (cobalt-platinum), CoPtCr (cobalt-platinum - chromium), SmCo (samarium cobalt), NdFeB (neodymium-iron-boron) and the like suit for a material of hard magnet film. Preferably, the film thickness of the hard magnet film is 5 to 100 nm. The magnetic domain control film can be also made of only the hard magnet film satisfying the condition of magnetostriction $\lambda s$ ($-15 \times 10^{-6} < \lambda s < 0$).

In the above-mentioned embodiment, the magnetic domain control antiferromagnetic films 56a and 56b are formed of an irregular base antiferromagnetic material and the antiferromagnetic layer 51 is made of a regular base antiferromagnetic material. However, the magnetic domain control antiferromagnetic films 56a and 56b may be made of a regular base antiferromagnetic material and the antiferromagnetic layer 51 may be made of an irregular base antiferromagnetic material. In this case, heat treatment is required for exchange coupling of the magnetic domain control antiferromagnetic films 56a and 56b to the magnetic domain control ferromagnetic films 55a and 55b and no heat treatment is required for exchange coupling of the antiferromagnetic layer 51 to the pinned layer 52.

Both the magnetic domain control antiferromagnetic films 56a and 56b and the antiferromagnetic layer 51 may be formed of a regular base antiferromagnetic material. In this case, heat treatment is required for both exchange coupling of the magnetic domain control antiferromagnetic films 56a and 56b to the magnetic domain control ferromagnetic films 55a and 55b and of the antiferromagnetic layer 51 to the pinned layer 52. As a result, the required temperature (a blocking temperature) for exchange coupling of the magnetic domain control antiferromagnetic films 56a and 56b to the magnetic domain control ferromagnetic films 55a and 55b and of the antiferromagnetic layer 51 to the pinned layer 52 need to be different.

Figure 19:
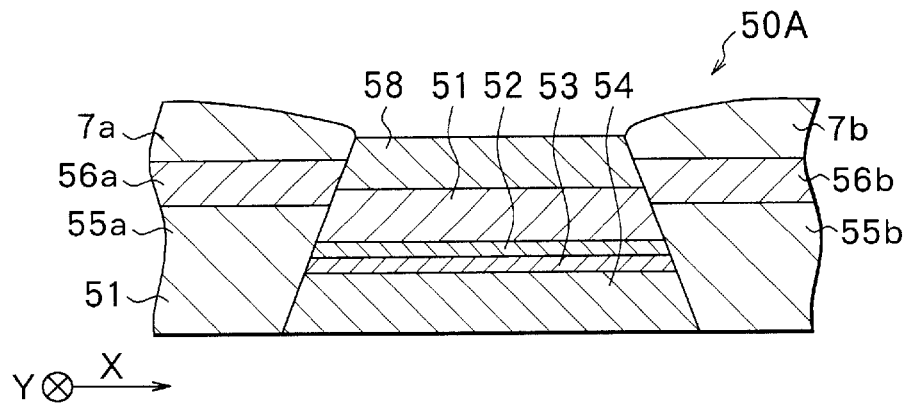
FIG. 19 is a sectional view illustrates another example of the structure of the MR element.
Figure 20:
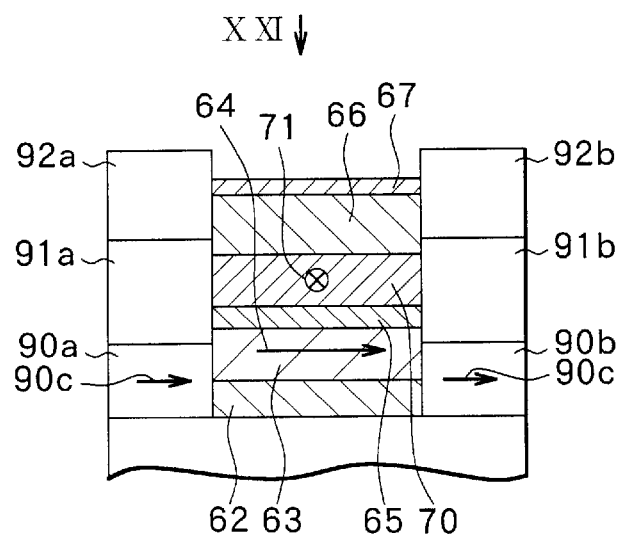
FIG. 20 is a view illustrates a sectional configuration of conventional magnetic transducer.
Figure 21:
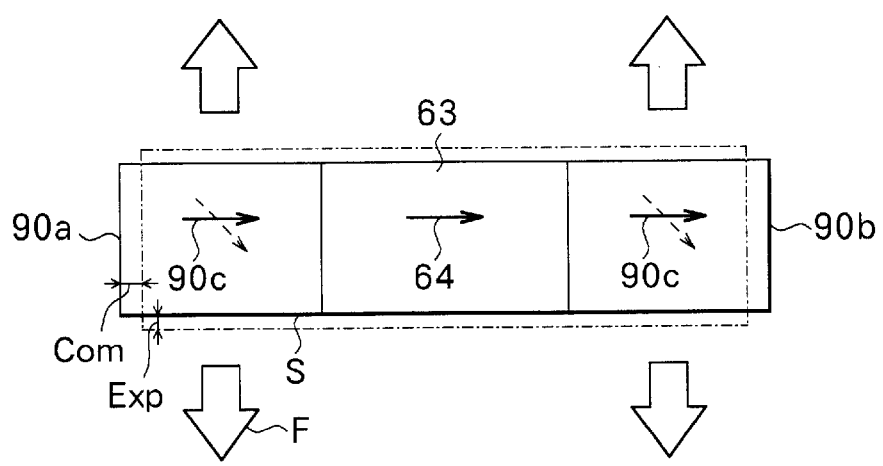
FIG. 21 is a view illustrates the orientation of the magnetization of each part of the magnetic transducer shown in FIG. 20.
Figure 22:
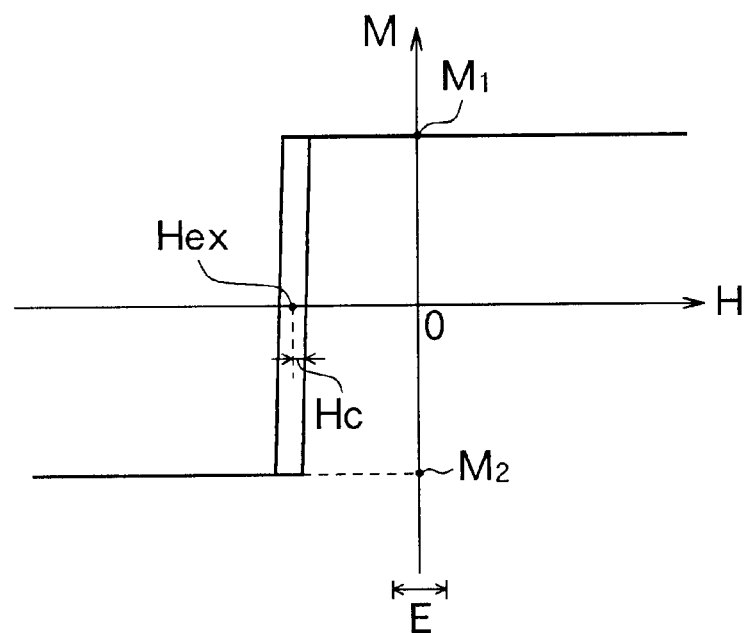
FIG. 22 is a view illustrates the relation of the magnetization of the magnetic transducer shown in FIG.20 and an external magnetic field.
Figure 23:
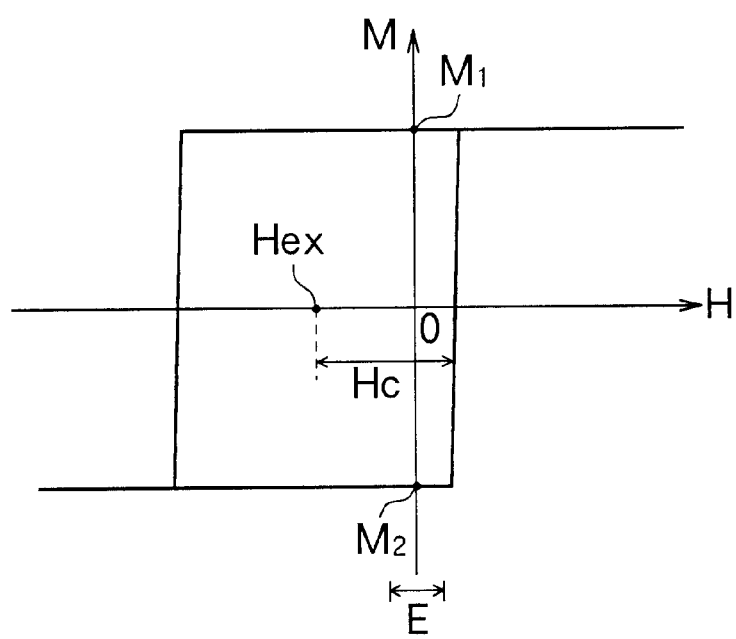
FIG. 23 is a view illustrates the relation of the magnetization of the magnetic transducer shown in FIG. 20 and an external magnetic field.

In the MR element 50 (FIG. 2) of the above-mentioned embodiment, the pinned layer 52, the nonmagnetic metal layer 53 and the free layer 54 are stacked on the antiferromagnetic layer 51 in the order named; however the order may be inverted. Namely, as illustrated in FIG. 19, the structure that the free layer 54, the nonmagnetic metal layer 53 and the pinned layer 52 are stacked on the antiferromagnetic layer 51 in this order is possible.

In each above-mentioned embodiment, although the description is made for the case where the magnetoresistive element of the invention is used for a composite type thin film magnetic head, the magnetoresistive element of the invention can be used only for a reproducing thin film magnetic head. In addition, the stack order of the recording and the reproducing heads may be inverted.

In each above-mentioned embodiment, although the magnetic separation layer is the nonmagnetic metal layer (for example, Cu), an insulating layer may be used instead of the nonmagnetic metal layer. In this case, the above-mentioned embodiment is applied to the tunnel junction magnetoresistive film (TMR film).

The magnetoresistive element of the invention can be applied to a sensor detecting a magnetic signal, a memory storing a magnetic signal and the like, for instance in addition to the thin film magnetic head of above-mentioned embodiments.

As described, according to the magnetic transducer and the thin film magnetic head of the invention, the magnetostriction $\lambda s$ of the magnetic domain control ferromagnetic film is within a range of $-15 \times 10^{-6} < \lambda s < 0$. As a result, hysteresis in a change of the magnetizaion of the magnetic domain control ferromagnetic film for an external magnetic field is suppressed. This enables stable bias magnetic field applied to the magneto-sensitive layer and to limit the rate of variation in reproducing output of the magneto-sensitive layer equal or less than 2%.

According to the magnetic transducer of the invention, the magnetic domain control ferromagnetic film is made of NiFe containing within a range of 82 to 90% by weight of Ni. As a result, the magnetostriction $\lambda s$ of the ferromagnetic film can be set to $-15 \times 10^{-6} < \lambda s < 0$ as described above.

According to the magnetic transducer of the invention, the magnetic domain control magnetization fix film for fixing the orientation of the magnetization of the magnetic domain control ferromagnetic film is made of an irregular base antiferromagnetic material. As a result, exchange coupling can be induced on an interface between the magnetic domain control ferromagnetic film and the magnetic domain control magnetization fix film without heat treatment.

According to the magnetic transducer and the methods of manufacturing the magnetic transducer and the magnetic head of the invention, the stack pattern consisted of the soft magnetic layer, the magnetic separation layer and the ferromagnetic layer and the magnetic domain control film are formed on the antiferromagnetic layer of the magneto-sensitive layer. As a result, the contact area of the magneto-sensitive layer and the magnetic domain control film (only the contact area of the antiferromagnetic layer and the magnetic domain control film) is widened and therefore the electrical contact resistance between the magneto-sensitive layer and the magnetic domain control film is reduced.

Furthermore, according to the magnetic transducer of the invention, the magnetostriction $\lambda s$ of the magnetic domain control ferromagnetic film is set to $-10 \times 10^{-6} < \lambda s < -1 \times 10^{-6}$ and therefore the rate of variation in reproducing output thereof is limited to equal or less than 1%.

Moreover, according to the magnetic transducer of the invention, the magnetostriction $\lambda s$ of the magnetic domain control ferromagnetic film is set to $-8 \times 10^{-6} < \lambda s < -2 \times 10^{-6}$ and therefore the rate of variation in reproducing output thereof is limited to equal or less than 0.5%.

Obviously many modifications and variations of the present invention are possible in the light of the above teachings. It is therefore to be understood that within the scope of the appended claims the invention may be practiced otherwise than as specifically described.

What is claimed is:

1. A magnetic transducer comprising:
a magneto-sensitive layer detecting an external magnetic field; and
a magnetic domain control film applying a longitudinal bias magnetic field to the magneto-sensitive layer, the magneto-sensitive layer further comprising:
a magneto-separative layer;
a soft magnetic layer formed on one side of the magneto-separative layer, the orientation of magnetization of the soft magnetic layer being freely changed by an external magnetic field;
a ferromagnetic layer formed on the other side of the magneto-separative layer; and
an antiferromagnetic layer formed on the ferromagnetic layer on the side opposite to the magneto-separative layer, and
the magnetic domain control film further comprising:
a magnetic domain control ferromagnetic film made of a ferromagnetic material; and
a magnetic domain control magnetization fix film for fixing the orientation of the magnetization of the magnetic domain control ferromagnetic film,
wherein a magnetostriction $\lambda s$ of the magnetic domain control ferromagnetic film is within a range of $-15 \times 15 \times 10^{-6} < \lambda s < 0$.

2. A magnetic transducer according to claim 1, wherein the magnetic domain control ferromagnetic film is formed including nickel-iron alloy (NiFe) containing within a range of 82 to 90% by weight of nickel.

3. A magnetic transducer according to claim 1, wherein the magnetic domain control magnetization fix film is formed of an antiferromagnetic material.

4. A magnetic transducer according to claim 3, wherein the magnetic domain control magnetization fix film is formed of an irregular base antiferromagnetic material.

5. A magnetic transducer according to claim 3, wherein the magnetic domain control magnetization fix film is formed of a material inducing an exchange anisotropy magnetic field on an interface between the magnetic domain control magnetization fix film and the magnetic domain control ferromagnetic film when the magnetic domain control magnetization fix film and the magnetic domain control ferromagnetic film are overlaid and requiring no heat treatment for inducing the exchange anisotropy magnetic field.

6. A magnetic transducer according to claim 1, wherein a stack pattern including the ferromagnetic layer, the magneto-separative layer and the soft magnetic layer is formed on the antiferromagnetic layer, and the magnetic domain control film is formed laterally adjacent to the stack pattern on the antiferromagnetic layer.

7. A magnetic transducer according to claim 1, wherein the magnetostriction $\lambda s$ of the magnetic domain control ferromagnetic film is within a range of $-10 \times 10^{-6} < \lambda s < -1 \times 10^{-6}$.

8. A magnetic transducer according to claim 1, wherein the magnetostriction $\lambda s$ of the magnetic domain control ferromagnetic film is within a range of $-8 \times 10^{-6} < \lambda s < -2 \times 10^{-6}$.

9. A magnetic transducer comprising:
a magneto-sensitive layer detecting an external magnetic field, the magneto-sensitive layer further comprising:
a magneto-separative layer;
a soft magnetic layer formed on one side of the magneto-separative layer, the orientation of magnetization of the soft magnetic layer being freely changed by an external magnetic field;
a ferromagnetic layer formed on the other side of the magneto-separative layer; and
an antiferromagnetic layer formed on the ferromagnetic layer on the side opposite to the magneto-separative layer; and
a magnetic domain control film applying a longitudinal bias magnetic field to the magneto-sensitive layer, the magnetic domain control film including a magnetic film having a magnetostriction λs within a range of $-15\times10^{-6}<\lambda s<0$.

10. A thin film magnetic head comprising:

a magnetic transducer having a magneto-sensitive layer detecting an external magnetic field, the magneto-sensitive layer including:
  a magneto-separative layer;
  a soft magnetic layer formed on one side of the magneto-separative layer, the orientation of magnetization of the soft magnetic layer being freely changed by an external magnetic field;
  a ferromagnetic layer formed on the other side of the magneto-separative layer; and
  an antiferromagnetic layer formed on the ferromagnetic layer on the side opposite to the magneto-separative layer; and a magnetic domain control film applying a longitudinal bias magnetic field to the magneto-sensitive layer, the magnetic domain control film including:
  a magnetic domain control ferromagnetic film made of a ferromagnetic material; and
  a magnetic domain control magnetization fix film for fixing the orientation of the magnetization of the magnetic domain control ferromagnetic film, wherein a magnetostriction λs of the magnetic domain control ferromagnetic film is within a range of $-15\times10^{-6}<\lambda s<0$.

11. A thin film magnetic head comprising:

a magnetic transducer having a magneto-sensitive layer detecting an external magnetic field, the magneto-sensitive layer further comprising:
  a magneto-separative layer;
  a soft magnetic layer formed on one side of the magneto-separative layer, the orientation of magnetization of the soft magnetic layer being freely changed by an external magnetic field;
  a ferromagnetic layer formed on the other side of the magneto-separative layer; and
  an antiferromagnetic layer formed on the ferromagnetic layer on the side opposite to the magneto-separative layer; and a magnetic domain control film applying a longitudinal bias magnetic field to the magneto-sensitive layer, the magnetic domain control film including a magnetic film having a magnetostriction λs within a range of $-15\times10^{-6}<\lambda s<0$.

12. A method of manufacturing a magnetic transducer including the steps of:

stacking an antiferromagnetic layer, a ferromagnetic layer, a magneto-separative layer and a soft magnetic layer on a substrate in the order named;

patterning the ferromagnetic layer, the magneto-separative layer and a soft magnetic layer to form a stack pattern including these three layers; and forming a magnetic domain control film for applying a longitudinal bias magnetic field to the stack pattern and including a magnetic film having a magnetostriction λs within a range of $-15\times10^{-6}<\lambda s<0$, laterally adjacent to the stack pattern on the antiferromagnetic layer.

13. A method of manufacturing a magnetic transducer according to claim 12, wherein the step of patterning is performed using ion milling.

14. A method of manufacturing a thin film magnetic head comparing a magnetic transducer having a magneto-sensitive layer detecting an external magnetic field and a magnetic domain control film applying a longitudinal bias magnetic field to the magneto-sensitive layer, wherein the magnetic transducer is formed by the steps of:

stacking an antiferromagnetic layer, a ferromagnetic layer, a magneto-separative layer and a soft magnetic layer on a substrate in the order named to form the magneto-sensitive layer;

patterning the ferromagnetic layer, the magneto-separative layer and a soft magnetic layer to form a stack pattern including these three layers; and forming a magnetic domain control film for applying the longitudinal bias magnetic field to the magneto-sensitive layer and including a magnetic film having a magnetostriction λs within a range of $-15\times10^{-6}<\lambda s<0$, laterally adjacent to the stack pattern on the antiferromagnetic layer.

15. A magnetic transducer comprising a magneto-sensitive layer detecting an external magnetic field and a magnetic domain control film applying a longitudinal bias magnetic field to the magneto-sensitive layer, the magnetic domain control film including:

a magnetic domain control ferromagnetic film made of a ferromagnetic material; and a magnetic domain control magnetization fix film formed of an irregular base anti-ferromagnetic material for fixing the orientation of the magnetization of the magnetic domain control ferromagnetic film, wherein the magnetostriction λs of the magnetic domain control ferromagnetic film is within a range of $-15\times10^{-6}<\lambda s<0$.

16. A magnetic transducer comprising a magneto-sensitive layer detecting an external magnetic field and a magnetic domain control film applying a longitudinal bias magnetic field to the magneto-sensitive layer, the magnetic domain control film including:

a magnetic domain control ferromagnetic film made of a ferromagnetic material; and a magnetic domain control magnetization fix film formed of an anti-ferromagnetic material for fixing the orientation of the magnetization of the magnetic domain control ferromagnetic film, the anti-ferromagnetic material inducing an exchange anisotropy magnetic field on an interface between the magnetic domain control magnetization fix film and the magnetic domain control ferromagnetic film when the magnetic domain control magnetization fix film and the magnetic domain control ferromagnetic film are overlaid, and the anti-ferromagnetic material requiring no heat treatment for inducing the exchange anisotropy magnetic field, wherein the magnetostriction λs of the magnetic domain control ferromagnetic film is within a range of $-15\times10^{-6}<\lambda s<0$.

* * * * *